United States Patent
Peterzell et al.

(10) Patent No.: US 6,694,129 B2
(45) Date of Patent: Feb. 17, 2004

(54) DIRECT CONVERSION DIGITAL DOMAIN CONTROL

(75) Inventors: Paul E. Peterzell, San Diego, CA (US); Gurkanwal Sahota, San Diego, CA (US)

(73) Assignee: Qualcomm, Incorporated, San Diego, CA (US)

(*) Notice: Subject to any disclaimer, the term of this patent is extended or adjusted under 35 U.S.C. 154(b) by 95 days.

(21) Appl. No.: 10/015,988

(22) Filed: Dec. 10, 2001

(65) Prior Publication Data

US 2002/0132597 A1 Sep. 19, 2002

Related U.S. Application Data

(60) Provisional application No. 60/261,714, filed on Jan. 12, 2001.

(51) Int. Cl.[7] .................................................. H04B 1/40
(52) U.S. Cl. .......................... 455/76; 455/78; 455/88; 455/208
(58) Field of Search .................. 455/552, 553, 455/131, 324, 322, 266, 234.1, 73, 323, 326, 112, 130, 316, 147, 78, 88, 552.1, 553.1, 76; 375/316, 324

(56) References Cited

U.S. PATENT DOCUMENTS

| 5,001,776 A | * | 3/1991 | Clark ........................ 455/226.2 |
| 5,179,730 A | * | 1/1993 | Loper ........................... 455/266 |
| 5,564,099 A | | 10/1996 | Yonekura et al. |
| 5,590,411 A | | 12/1996 | Sroka et al. |
| 5,828,955 A | * | 10/1998 | Lipowski et al. ............ 455/324 |
| 5,918,167 A | | 6/1999 | Tiller et al. |
| 6,009,126 A | * | 12/1999 | Van Bezooijen ............. 375/319 |
| 6,029,052 A | * | 2/2000 | Isberg et al. ................. 455/131 |
| 6,366,622 B1 | * | 4/2002 | Brown et al. ................ 375/322 |
| 6,397,044 B1 | * | 5/2002 | Nash et al. .................... 455/73 |
| 6,560,448 B1 | * | 5/2003 | Baldwin et al. .......... 455/234.1 |

FOREIGN PATENT DOCUMENTS

| EP | 0 729 230 A1 | * | 8/1996 | ............. H03J/7/04 |
| EP | 0969601 | | 6/1999 | |
| WO | 9741643 | | 11/1997 | |
| WO | WO 97/41643 | * | 11/1997 | ............. H04B/1/06 |
| WO | WO 99/63656 | * | 12/1999 | ............. H03F/3/19 |

* cited by examiner

*Primary Examiner*—Sonny Trinh
(74) *Attorney, Agent, or Firm*—Philip R. Wadsworth; Charles D. Brown; Kevin T. Cheatham

(57) ABSTRACT

A system and method for a multi-band direct conversion wireless communication receiver is presented. The system incorporates a low noise amplifier (LNA) configured to amplify received RF signals, a local oscillator (LO) configured to output a frequency, and I and Q channel mixers. Each mixer has a first input operatively coupled to the LNA, a second input operatively coupled to the LO output, and an output. The system further includes an adjustment mechanism configured to adjust drive level of the LO depending on a level of jammers detected by the receiver. Thus, the receiver may operate in multiple wireless communication bands and modes and meet the associated specifications.

45 Claims, 9 Drawing Sheets

DIRECT CONVERSION DIGITAL DOMAIN CONTROL

RELATED APPLICATIONS

This application claims priority to pending Provisional application No. 60,261,714, filed on Jan. 12, 2001 and pending U.S. patent application Ser. No. 09/797,746, filed Mar. 1, 2001.

BACKGROUND

1. Field

This invention relates in general to wireless communications. Specifically, this invention relates to systems and methods for direct conversion transceivers.

2. General Background and Related Art

The field of communications has experienced a tremendous growth due in large part to the improved capabilities of wireless devices. Wireless devices employ radio waves to enable distant communications without the physical constraints of wire-based systems. Information, such as voice, data, or paging information, is conveyed by radio waves transmitted over predetermined frequency bands. Allocation of available frequency spectra is regulated to ensure that numerous users may communicate without undue interference.

Information to be transmitted from a source to a destination is seldom acquired in a format that is ready for radio transmission. Typically, a transmitter takes an input signal and formats it for transmission in a predetermined frequency band. The input signal, also referred to as a baseband signal, modulates a carrier in the desired frequency band. For example, a radio transmitter that receives an audio input signal modulates a carrier frequency with the input signal.

A corresponding remote receiver tuned to the same carrier frequency as the transmitter must receive and demodulate the transmitted signal. That is, the remote receiver must recover the baseband signal from the modulated carrier. The baseband signal may be directly presented to a user or may be further processed prior to being presented to the user. Many consumer wireless devices, such as radios, televisions, and pagers, are solely receivers.

Transceivers are wireless devices that integrate a transmitter and receiver in a single package. Transceivers enable nearly instantaneous two-way communications. Examples of transceivers include two-way radios, walkie-talkies, two-way pagers, and wireless phones.

Several figures-of-merit are important in assessing the effectiveness of a receiver design. Sensitivity determines the ability of a receiver to detect a weak signal. Receiver sensitivity must be such that the receiver can detect the minimal discernible signal (MDS) from background noise. Noise represents random fluctuations in voltage and current. The MDS is a receiver-specific measure of sensitivity that incorporates the bandwidth of a given system. Receiver selectivity, on the other hand, indicates the protection afforded a receiver from off-channel interference. The greater the selectivity, the better the receiver can reject unwanted signals.

Desense is a reduction in a receiver's overall sensitivity due to man-made or natural radio frequency interference (RFI). Desense occurs when a very strong interfering signal overloads the receiver and makes the detection of weaker signals more difficult. The desensitization characteristic of the receiver determines its ability to operate successfully under strong interferors, such as jammers.

The noise figure is another key measure of a receiver's performance. The noise figure degrades, that is, increases, at each successive stage in the receive path. Amplification or attenuation techniques may be applied within a receiver to achieve an acceptable noise figure. Noise, along with distortion, determines signal to noise and distortion (SINAD), a ratio in decibels which describes a receiver's performance in the presence of noise.

Distortion is the presence of unwanted signals at the output of devices in the RF path of a receiver. Distortion may include harmonic distortion, intermodulation distortion, and cross-modulation distortion. Harmonic distortion occurs when the desired input signal is large enough to compress the receiver and is typically measured at the baseband output as a function of frequency offset from the desired signal and as a function of the desired signal power. Crossover distortion occurs when the amplitude-modulated component from the transmitter (e.g., a CDMA wireless phone) is transferred to another carrier (jammer) at the output of the device (LNA output). The most common form of distortion is intermodulation distortion (IMD).

Intermodulation distortion is the result of two or more signals mixing together to produce additional unwanted distortion within the signal bandwidth. For two inputs, the intermodulation products occur at the sum and difference of integer multiples of the original frequencies. That is, for two input signals having frequencies $f_1$ and $f_2$, the output frequency components can be expressed as $mf_1 \pm nf_2$, where m and n are integers $\geq 1$. The order of the intermodulation product is the sum of m and n. "Two tone" third order components ($2f_1-f_2$ and $2f_2-f_1$) can occur at frequencies near the desired or interfering signals and thus cannot be easily filtered. Higher order intermodulation products have lower amplitude; as such, they are less problematic. Second order intermodulation jamming products may be generated at baseband frequencies if the tone spacing is within half of the signal bandwidth.

FIG. 1 is a graph plotting the levels of fundamental, second order, and third order IMD components against input level. Theoretical points where the second order and third order levels intercept the fundamental are known as the second order intercept point (IP2 or SOI) and third order intercept point (IP3 or TOI). The IIP2 of a receiver is the input level second order intercept point. The IIP3 is the input level third order intercept point.

The third order intercept point and noise figure of a receiver are directly related to the receiver's dynamic range. The dynamic range defines the range of signals that the receiver can handle within the specified performance of the receiver, that is, the range over which the receiver can produce an accurate output with acceptable SINAD. Specifically, for a baseband receiver, such as an analog-to-digital converter, the dynamic range may be represented as spurious free dynamic range (SFDR), which ranges from the noise floor of the device to the maximum signal before clipping occurs.

Local oscillator (LO) leakage occurs when an LO signal leaks to the receiver input. Such leakage may be transmitted by the transceiver antenna as spurious emissions, which may interfere with other devices. In addition, LO leakage may be reflected back into the receiver itself and may desense the receiver if not removed prior to demodulation.

Jammer leakage occurs when a jammer signal leaks to an LO input or output of a device within a receiver. Such leakage may mix with the jammer signal to produce undesired signals, such as DC signal levels that are proportional to the amplitude modulation (AM) component of the jammer signal. AM jammer signals may be located at any frequency within a receive frequency band.

Low-frequency flicker (1/f) noise is caused by defects in the emitter-base junction of bipolar junction transistors. Although typically small, flicker noise and other such noise may need to be removed in a receiver in order to maintain signal integrity at baseband.

Isolation is the ratio (in dB) of the power level applied at one port of a device to the resulting power level at the same frequency appearing at another port. Reverse isolation, which is the inverse (reciprocal) of isolation, is a figure-of-merit for receiver components. Reverse isolation is a measure of how much energy injected into an output port makes it back into the input source. To achieve low LO and jammer leakage, high reverse isolation is desired.

The 1 dB compression point of an amplifier is a measure of the output power level when the amplifier gain is 1 dB lower than the small signal gain. The saturation point of an amplifier is a measure of the maximum output power capability of the amplifier. These figures-of-merit are illustrated in FIG. 1.

The above figures-of-merit and signal phenomena should be considered when designing wireless communication devices. More generally, the wireless communications landscape has been dominated by Code Division Multiple Access (CDMA), a form of spread spectrum, or broadband, communications in which radio signals are spread over a very wide bandwidth. CDMA technologies have been the basis for many modulation standards, such as CDMA (IS-95 and CDMA2000) and WCDMA (IMT2000). Each of these modulation or air-interface standards operates in many radio frequency bands, including Cellular (Japan Cellular and US Cellular), PCS (Personal Communications System in US and Korean bands), and IMT (International Telecommunications Union). Other modulation standards include FM (frequency modulation, IS-19), GSM (Global System for Mobile Communications), US-TDMA (IS-136), GPS (Global Positioning System), Wireless LAN (802.11), and Bluetooth.

Frequency bands have been allocated to various communications modes. For wireless transceivers, the US PCS receive (RX) frequency band is 1930–1990 MHz, and the associated transmit (TX) frequency band is 1850–1910 MHz. The US Cellular receive frequency band is 869–894 MHz, and the associated transmit frequency band is 824–849 MHz. Similarly, receive and transmit frequency bands are allocated to Japan Cellular, IMT, and Korean PCS.

Communications standards set forth specifications that wireless communication devices must meet. For instance, spurious emissions, sensitivity, jamming (two-tone intermodulation and single-tone desense), and residual sideband specifications must be met.

Wireless communications have not yet been standardized on an international, or even intranational, basis. Existing technologies have recognized that a transceiver that can operate in more than one band, or in more than one mode, has increased portability. In particular, dual band handsets operate on two frequency bands. For instance, a dual band CDMA handset can operate on both the 800 MHz (US Cellular) and 1.9 GHz (US PCS) frequency bands. If base stations operating on these two bands use the CDMA standard, then a mobile unit having a dual band CDMA handset may obtain service from either or both of these base stations. Further, a dual mode CDMA/FM handset may operate in both CDMA and FM modes. Yet, given the current multiplicity of modulation standards and associated frequency bands, dual mode and dual band phones offer subscribers at most a limited compatibility with communications systems of the world.

FIG. 2 is a high-level block diagram of a conventional dual downconversion receiver. Receiver 101 incorporates the super heterodyne architecture. In particular, a received RF signal 11 is conveyed along an RF signal path and preprocessed (stage 1). The preprocessed RF signal 13 is first translated, or downconverted, to a signal 15 having an intermediate frequency (IF) (stage 2). The IF signal 15 is then downconverted again to a baseband signal 17, which includes an "in-phase" (I) and "quadrature" (Q) phase component (stage 3). The I and Q baseband signal components vary in phase by 90°. The I and Q components are then sent to other portions of receiver 101, such as a baseband processor (stage 4), to be further processed. Similarly, in a dual upconversion transmitter, analog I and Q baseband signals are first upconverted to an IF signal, and the IF signal is then upconverted to a transmitted RF signal.

FIG. 3 illustrates receiver 101 in more detail. Receiver 101 has a number of inherent benefits. For example, the design offers excellent sensitivity and selectivity, an extended signal dynamic range, flexible frequency planning, and a lower dynamic range and current consumption for elements in receiver 101 after IF filters 70. In addition, phase and amplitude matching between the I and Q channels 106, 107 may be achieved more easily because the IF signal is at a lower frequency range. In view of these benefits, receiver 101 is well-suited for multi-mode and multi-band applications, wherein received RF signals—modulated in multiple modes and conveyed in multiple frequency bands—may be processed.

To support multiple bands and modes of operation, receiver 101 must include some mode-specific components. For instance, in a multi-band receiver, an individual RF signal path is typically required for each frequency band. In a multi-mode receiver, individual baseband paths may be required for each mode depending on jammer dynamic range requirements.

In conventional receivers such as receiver 101, the IF signal path typically includes amplifiers, filtering, and automatic gain control (AGC) circuitry. As such, receiver 101 can eliminate out-of-signal-band noise and jammers and can compensate for varying signal power and receiver gain changes. In a multi-mode receiver, filtering of IF signals is mode-specific. Therefore, receiver 101 has one IF filter 70 per mode. For instance, a receiver in a dual mode phone includes two IF SAWs (surface acoustic wave filter). For a receiver which supports the CDMA 1X, CDMA 3x, WCDMA, GSM, FM, Bluetooth, and GPS modes, four to six SAWs and 1 discrete LC filter may be required in the IF signal path.

The need for an IF filter for each mode is a significant drawback of receiver 101. Each IF filter increases the cost of the receiver, the number of critical parts, and the board area of the receiver. Because each IF filter may have high loss, an IF pre-amp or AGC may also be needed. An IF voltage controlled oscillator (VCO) and phase-locked loop (PLL) 65 are also needed to generate a local oscillator (LO) frequency, which is inputted to IF mixer 60. Additional drawbacks of receiver 101 include the need for a switch matrix or multiple IF amplifiers and AGC modules, the need for a low-loss RF bandpass filter (BPF) to reduce undesired sideband noise, and the need for additional IF mixers. Thus, the IF stage of a dual downconversion receiver increases cost, design complexity, and circuit board area of such receivers.

FIG. 4 is a block diagram of a direct downconversion, or zero IF, receiver 200. In direct downconversion receivers, a received RF signal 201 is directly downconverted to a baseband signal 225. Similarly, in a direct upconversion, or zero IF, transmitter, a baseband signal is directly upconverted to a transmitted RF signal. In receiver 200, the received RF signal is mixed with a local oscillator (LO) frequency to produce a baseband signal. Because it does not incorporate an IF signal path, receiver 200 eliminates cost, board area, and power consumption associated with IF components, which include IF SAWs, LC matching and discrete filters, a pre-amp, AGC, IF mixers, and the IF VCO and PLL. Further, less part-to-part and temperature variation occurs.

The design of receiver 200 allows for more signal processing, such as channel selectivity filtering, to occur in the baseband analog or digital domain via integrated circuits, thus enabling RF and analog portions of receiver 200 to be more generic in nature. Since the AGC is digital, simplified calibration, or even no calibration, may be required. For certain modes of operation, such as GPS, Bluetooth, and GSM, receiver 200 may not require an RF filter because a primary purpose of that filter is to reduce cross-modulation in CDMA Cellular and PCS modes. However, the GPS mode may require an RF filter if GPS-modulated signals are simultaneously received with other modulated signals.

Despite the above advantages, direct downconversion has not been widely incorporated into wireless phones. The reason is that it is very difficult to achieve key receiver design goals while achieving the proper dynamic range for the receiver. Design goals for receivers such as receiver 200 include achieving high gain and a low noise figure, high IIP3 and IIP2 values, and low power consumption. A multi-mode and multi-band receiver may require a very wide dynamic range. Accordingly, it is even more difficult to achieve these design goals for such a receiver.

More specifically, local oscillator (LO) leakage and jammer leakage into the I and Q mixer LO ports cause significant problems in direct downconversion receivers. For Cellular and PCS, the spurious emissions requirements are particularly stringent. As such, higher reverse isolation is needed. Additionally, in a direct downconversion receiver, LO leakage that is reflected back into the receiver itself, as well as jammer leakage to the LO port of the I and Q mixers, may be processed by the direct downconversion circuitry. As such, an undesired DC offset voltage may appear at the output of the mixer along with the desired baseband signal, which may also contain baseband spectral components. Accordingly, the DC offset must be removed to ensure that the signal-to-noise ratio is sufficiently high.

In CDMA, sensitivity is tested with a signal set to a level such that a certain frame error rate (FER) is met. IS-98 specifies that the device under test must meet a sensitivity level of −104 dBm (signal power) with less than 0.5% FER. The intermodulation test is conducted with a signal level set to −101 dBm (3 dB above the sensitivity test) with two tones at an offset relative to the RF signal (−43 dBm/tone at offsets that generate an in-band distortion product, or typically ±900 and ±1700 kHz) with less than 1% FER. Depending on the frequency band, there may be differences in the power levels tested and frequency offsets for the jammers. For the single-tone desense test, the jammer level at the RF port of the I and Q mixers is larger than the signal level by 71 dB at >=900 kHz offset.

The jammer power may leak to the LO port of each mixer and mix with the jammer level at the mixer RF port to produce a DC level that is proportional to the amplitude of the RF jammer. Typically, the jammer is generated by the forward link of a base station in a competing wireless system. The jammer power may change as a function of the modulation used or fading. The worst jammer may have amplitude modulation comparable to the desired signal bandwidth. As such, the AM component falls on top of any signal energy at baseband after downconversion and cannot be removed with baseband filtering. This problem is exacerbated as the jamming RF signal increases. If the jamming RF signal increases by 10 dB, for example, the baseband distortion increases by 20 dB. This baseband distortion can actually be greater than a two-for-one slope if both the RF to LO isolation of the RF mixers, which affects self-mixing of jammers, and the IIP2 of the RF mixers, which represents second order distortion effects, are poor.

Further, the jammer and LO leakage requirements for mixers in a direct downconversion receiver are very demanding. Because such a receiver lacks IF filtering, the dynamic range of the receiver baseband elements may need to be increased by 30 dB or more, depending on the degree of baseband analog filtering, and part-to-part, frequency, and temperature variations in gain. Residual sideband specifications for various modulation standards must also be met. Since such a receiver has less gain before its baseband stage, flicker noise at baseband has a greater effect on the ability of the receiver to process FM-modulated signals.

Therefore, what is needed is a direct conversion receiver that can demodulate RF signals in multiple bands and multiple modes in the presence of strong interferors with minimal current and process technology improvements.

SUMMARY

The disclosed embodiments show novel and improved systems and methods for a multi-band direct conversion wireless communication receiver. In a first embodiment, a system includes a low noise amplifier (LNA) configured to amplify received RF signals, a local oscillator (LO) configured to output a frequency, and I and Q channel mixers. Each mixer has a first input operatively coupled to the LNA, a second input operatively coupled to the LO output, and an output. The system further includes an adjustment mechanism configured to adjust drive level of the LO depending on a level of jammers detected by the receiver. The adjustment mechanism may include a first measurement mechanism configured to measure total power of the received RF signals, a second measurement mechanism configured to measure signal power of baseband signals, a comparison mechanism configured to compare the total power of the received RF signals with the signal power of baseband signals, and an adjustor configured to adjust a setpoint of the LO based on the comparison.

In another embodiment, a system includes an LNA configured to amplify received RF signals, an LO configured to output a frequency, I and Q channel mixers, and baseband portions. Each mixer has a first input operatively coupled to the LNA, a second input operatively coupled to the LO output, and an output. A baseband portion is coupled to each mixer output. The system further includes an adjustment mechanism configured to adjust gain of the LNA and each mixer depending on a level of the received RF signals and drive level of the LO depending on a level of jammers detected by the receiver.

In another embodiment, the system incorporates an LNA configured to amplify received RF signals, an LO configured to output a frequency, I and Q channel mixers, and an adjustment mechanism. Each mixer has a first input operatively coupled to the LNA and a second input operatively coupled to the LO output. The adjustment mechanism is configured to adjust gain of the LNA and each mixer as the signal level of the received RF signals increases. The gain adjustments balance the reverse isolation of active components in the RF path of the receiver with the required dynamic range to demodulate the signal in the presence of one or more jammers. The gain may be adjusted continuously or stepped down.

BRIEF DESCRIPTION OF THE DRAWINGS

The features, objects, and advantages of the disclosed embodiments will become more apparent from the detailed description set forth below when taken in conjunction with the drawings in which like reference characters identify correspondingly throughout, and wherein.

DETAILED DESCRIPTION

Figure 1:
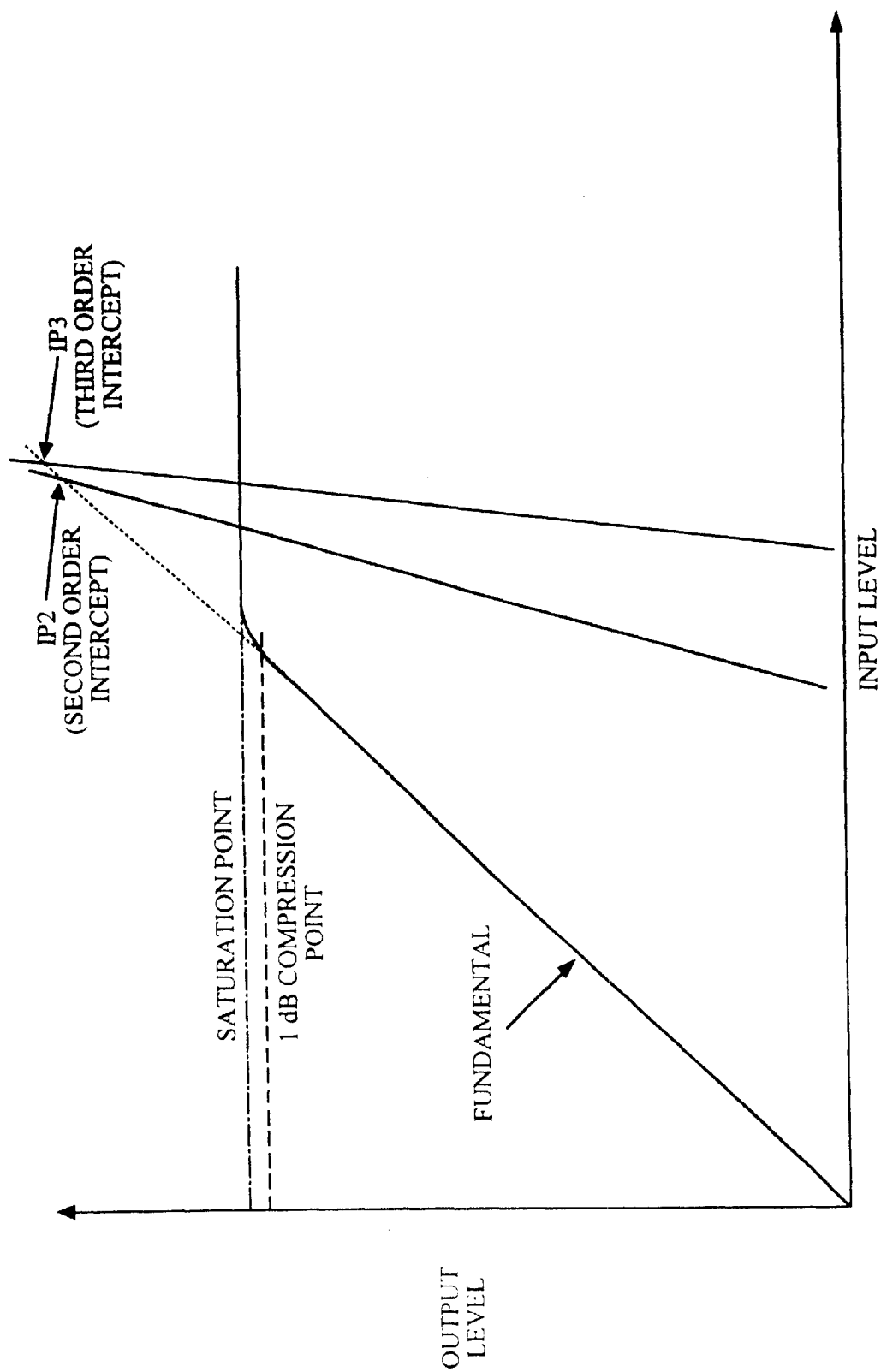
FIG. 1 is a graph plotting the saturation and compression points, and the second order and third order intercept points.
Figure 2:
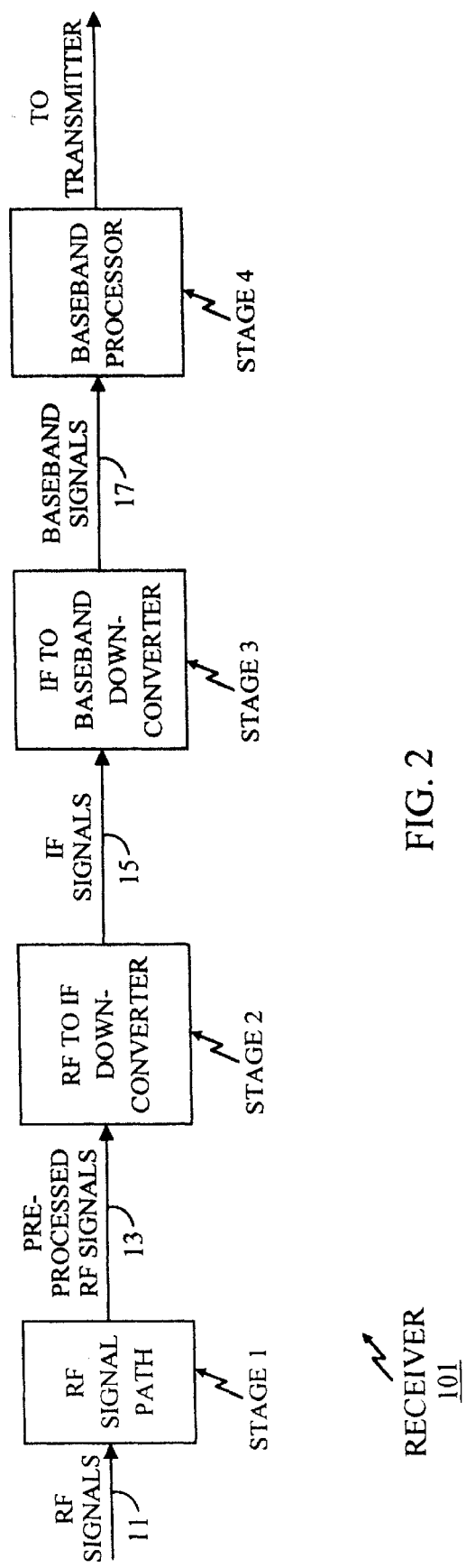
FIG. 2 is a high-level block diagram of a conventional dual conversion receiver.
Figure 3:
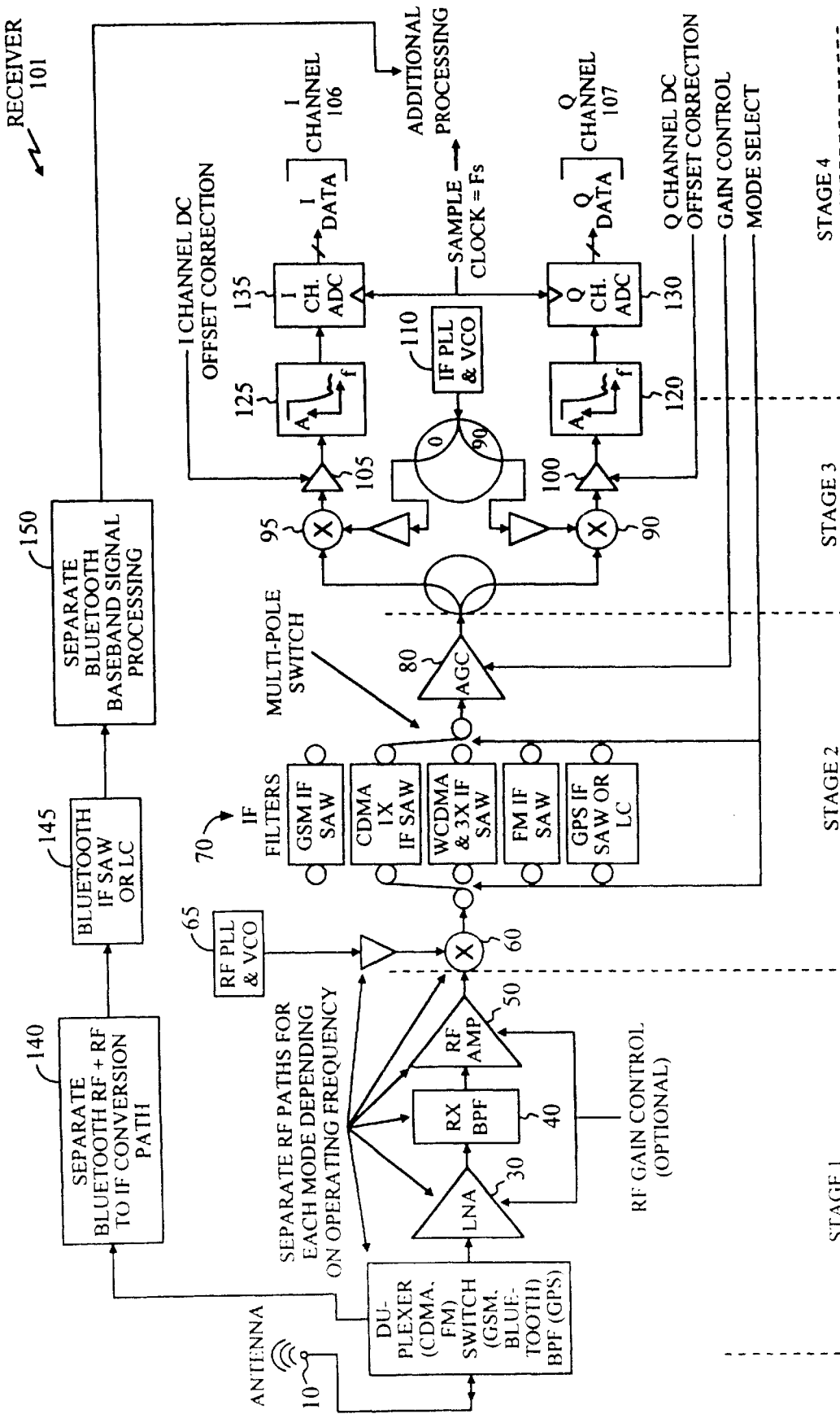
FIG. 3 is a block diagram of a conventional dual conversion receiver.
Figure 4:
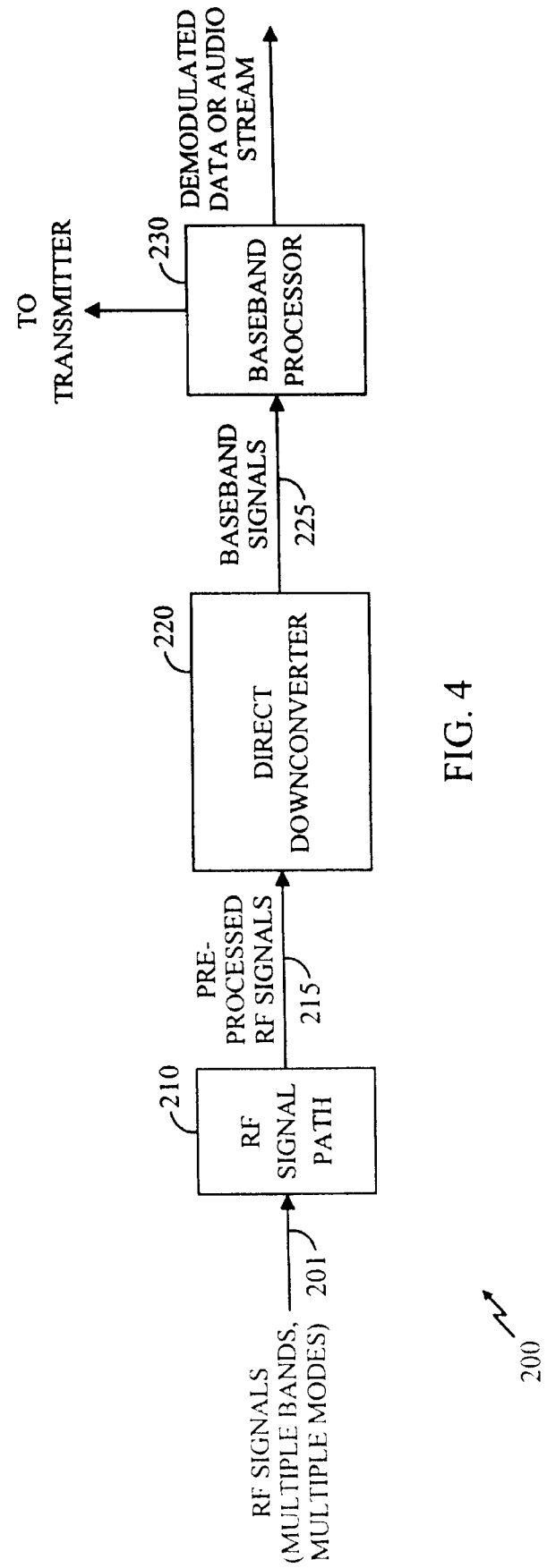
FIG. 4 is a high-level block diagram of a direct conversion receiver.

FIG. 4 is a high-level block diagram of direct downconversion receiver 200 according to an embodiment of the present invention. Receiver 200 comprises an RF signal path 210, a direct downconverter 220, and a baseband processor 230.

RF signal path 210 receives RF signals 201. RF signals 201 may comprise signals modulated in multiple modes and conveyed in multiple frequency bands. RF signal path 210 may include selection mechanisms to select among various modes and various bands. Additionally, RF signal path 210 may include amplifiers or filters to prepare RF signals 201 for further processing. Such prepared signals are designated as preprocessed RF signals 215 in FIG. 4. Direct downconverter 220 receives preprocessed RF signals 215 from RF signal path 210 and downconverts such signals to baseband signals 225.

Baseband processor 230 may perform subsequent processing on baseband signals 225, such as, for example, DC cancellation, matched and jammer filtering, sample decimation, automatic gain control, signal power measurement (received signal strength indicator, RSSI), despreading, deinterleaving, error correction, and decoding into digital data or audio streams. The processed information may then be routed to an appropriate destination, such as an output mechanism in a wireless device, which may include a display, loudspeaker, or data port. It is to be noted that baseband processor 230 may also be used by a transmitter that is complementary to receiver 200.

Figure 5:
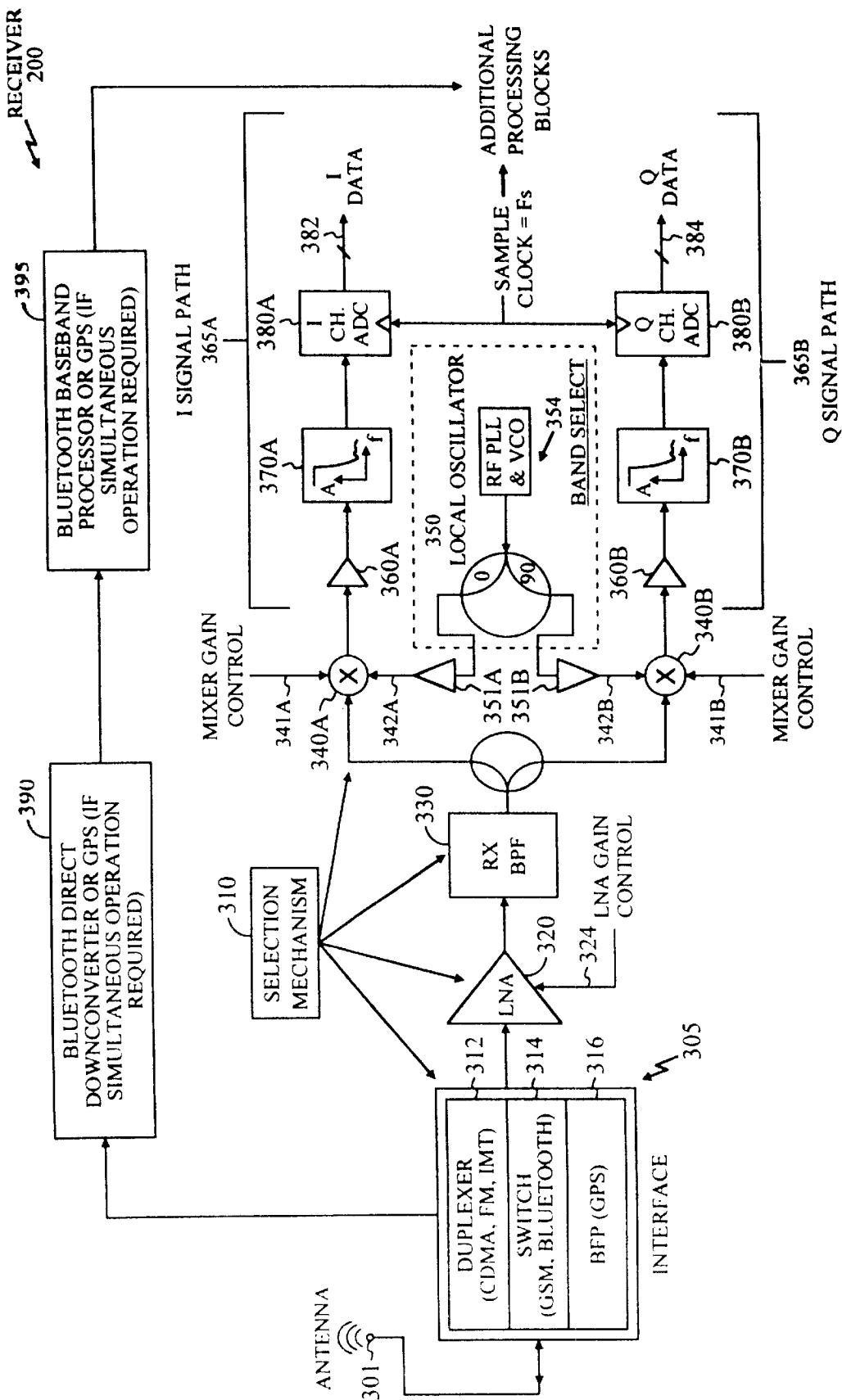
FIG. 5 is a block diagram of a direct conversion receiver.

FIG. 5 illustrates receiver 200 in more detail. An antenna 301 interfaces receiver 200 to incoming RF signals. Antenna 301 may also broadcast RF signals from a transmitter coupled to antenna 301. Multiple antennas may be used for separate operating bands or to isolate simultaneous operating modes from one another. Interface 305 may isolate received RF signals from transmitted RF signals such that receiver 200 and a transmitter may both use antenna 301.

Interface 305 may comprise one or more duplexers 312. Duplexer 312 filters signals in the incoming receive band. Additionally, duplexer 312 separates signals in the incoming receive band from signals in the outgoing transmit band. Multiple duplexers 312 may be employed if multiple bands of operation are required by a particular receiver or transceiver application. As shown in FIG. 5, one duplexer 312 may process signals modulated in the CDMA, FM, and IMT modes, assuming that the associated operating bands all fit within a band of duplexer 312.

Interface 305 may also comprise one or more switches 314 and bandpass filters 316. Switch 314 selects between receive and transmit operations. For instance, switch 314 may correspond to the GSM or Bluetooth modes, in which signals are not received and transmitted simultaneously. Bandpass filter 316 filters GPS signals in the incoming receive band. Because GPS signals are received, and not transmitted, a duplexer need not be employed. Other bandpass filters 316 may be included in receiver 200 for other analogous receive-only modes.

A low noise amplifier (LNA) 320 is coupled to interface 305 and amplifies received RF signals. LNA 320 may be chosen to provide a minimal noise figure in the receive band, but a sufficiently high gain to minimize noise figure contributions from subsequent stages in receiver 200. The gain of LNA 320 may be controlled via an LNA gain control 324. Transmit power may leak into receiver 200 from interface 305. For instance, duplexer 312 may not entirely filter the transmit power. Thus, LNA 320 may require a high compression and third order intercept point.

LNA 320 is coupled to a RX bandpass filter (BPF) 330. BPF 330 further rejects transmitter signals that fall outside of the receive band. It is to be noted that BPF 330 may not be necessary in some embodiments of the present invention. For instance, as noted earlier, signals modulated in the GSM mode may not be received and transmitted simultaneously if maximum data rates in GPRS (General Packet Radio Service) are not supported.

FIG. 5 depicts one RF signal path including one duplexer 312, one LNA 320 and one BPF 330. However, multiple RF signal paths may be included in receiver 200. Each signal path may correspond to one or more particular operating frequency bands of receiver 200. For instance, receiver 200 may include respective Cellular, PCS, IMT, and GSM signal paths. Each RF path may include, as needed, a duplexer, switch, and/or bandpass filter, a LNA, a BPF, and I and Q mixers. Additionally, simultaneous GPS reception while operating with other modes may require separate LO generation, baseband amplifiers, analog low-pass filters, analog-to-digital converters, I/Q digital processing, and demodulation.

Selection mechanism 310 switches among different RF signal paths depending on operating frequency bands active at a given time. Selection mechanism 310 may comprise a band select device coupled to, for example, various duplexers and BPFs. Selection mechanism 310 may also be coupled to I and Q channel mixers 340A, 340B. For instance, for received signals in the US Cellular band, selection mechanism 310 may switch to a duplexer 312, a LNA 320, and a BPF 330 that together appropriately filter and amplify the received signals.

The output of BFP 330 is coupled to an input of I and Q channel mixers 340A, 340B. In an exemplary implementation, BPF 330 may have a differential output (not shown) to connect to differential inputs (not shown) of mixers 340A, 340B. Accordingly, the positive and negative output terminals of BPF 330 may be coupled to the positive and negative input terminals of mixer 340A, and to the positive and negative input terminals of mixer 340B. Such a differential signal path arrangement reduces LO and TX coupling into the RF signal path and increases common mode rejection of amplitude-modulated jammers (higher second order input intercept level at the mixer inputs). Thus, isolation and jammer rejection in receiver 200 is improved.

Alternatively, a transformer may be coupled to a single-ended output of BPF 330. The transformer may convert the single-ended signal to a differential signal, which may be coupled to differential inputs of mixers 340A, 340B.

As shown in FIG. 5, a local oscillator (LO) 350 is coupled to buffer amplifiers 351A, 351B. Buffer amplifiers 351A, 351B are coupled to a second input 342A of mixer 340A and a second input 342B of mixer 340B, respectively. Buffer amplifiers 351A, 351B may have differential outputs if I and Q mixers 340A, 340B have differential inputs. In some embodiments, buffer amplifiers need not be included in the design of receiver 200.

LO 350 may comprise a frequency generator that may generate output signals at various frequencies. For instance, LO 350 may output a first signal and a second signal that is phase-shifted from the first signal by 90°. LO 350 may include a phase-locked loop (PLL), a voltage controlled oscillator (VCO), a frequency mixing mechanism, and a phase shifting mechanism. LO 350 may include a band select 354 that controls LO 350 depending on an operating frequency of received RF signals. In an exemplary embodiment, LO 350 uses differential paths to mitigate LO leakage and noise coupling to and from the signal paths at the I and Q mixer RF ports.

Each mixer 340A, 340B mixes a received RF signal from BPF 330 with a signal received from LO 350 at the second input 342A, 342B of mixers 340A, 340B. The mixing process multiplies the signals together. Thus, mixers 340A, 340B directly downconvert received RF signals to I and Q baseband signals. In an exemplary implementation, mixers 340A, 340B have associated gain that may be adjusted via mixer gain control 341A, 341B.

After downconversion, the I and Q signals are processed along respective signal paths 365A, 365B. The I signal path 365A is representative of both signal paths, and may include an amplifier 360A, an anti-aliasing filter 370A, and an I channel analog-to-digital converter (ADC) 380A. Amplifier 360A is coupled to the output of mixer 340A. After processing and analog-to-digital conversion along the respective signal paths, digital I channel data 382 and Q channel data 385 may be further processed. In some embodiments, the I and Q signals may be processed along operating mode-specific paths. In other embodiments, I and Q signal paths may be shared among modes.

Receiver 200 may contain Bluetooth-specific modules. Bluetooth direct downconverter 390 and Bluetooth baseband processor 395, as shown in FIG. 5, may be functionally and structurally similar to the structures described above. However, because Bluetooth may operate concurrently with other operating modes, such as CDMA, Bluetooth direct downconverter 390 and baseband processor 395 may be implemented as Bluetooth-dedicated modules. Similarly, GPS may operate concurrently and require a separate baseband signal path and LO generation circuitry.

Figure 6:
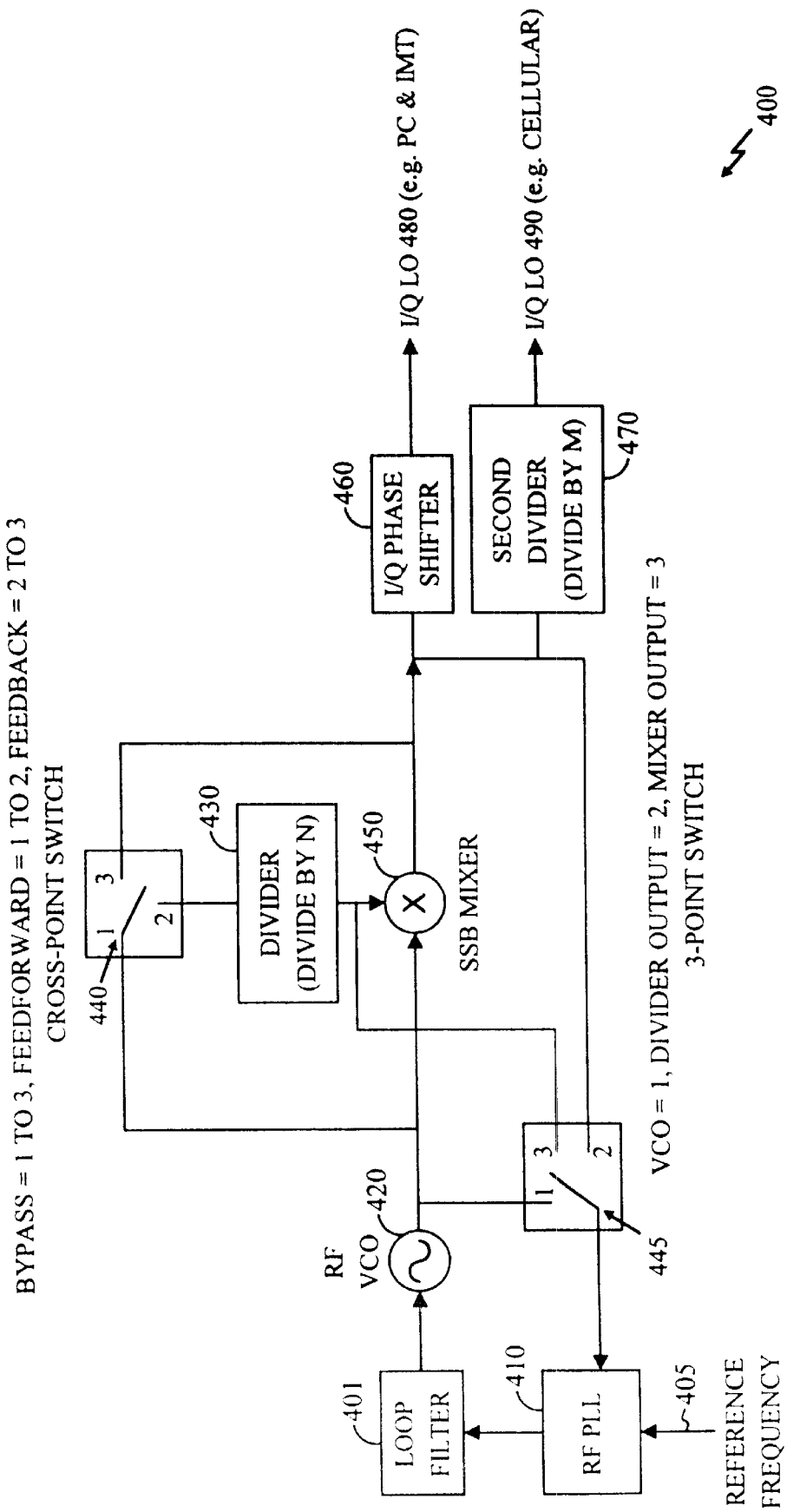
FIG. 6 is a model for approximating AM jammer suppression in a direct conversion receiver.

FIG. 6 is a model for approximating the amount of AM jammer suppression needed in a direct conversion receiver such as receiver 200. For CDMA, required jammer suppression may be approximated as the ratio of the baseband signal to the baseband jammer. In model 600, an RF RX section 601 models the gain of the RF portion of the receiver from the receiver's antenna to the receiver's mixer output. RF section 601 has gain G decibels. The RF signal level at the input of RF section 601 is S_RF (in dB). The jammer level at the input of RF section 601 is J_RF (in dB). RF section 601 respectively amplifies these input signals to produce outputs of S_RF+G, and J_RF+G.

Model 600 also includes mixer 610, which represents the I and Q LO mixers in the receiver. The RF to LO isolation of mixer 610 is designated as S31. The RF to baseband conversion gain or loss of mixer 610 is S21. The LO drive level is LO. The jammer power leakage to the LO port is J_RF_LEAK, or J_RF+G+S31. The RF to baseband conversion loss for the AM modulated jammer is S21(AM), or S21+(J_RF_LEAK-LO). S21(AM) is a measure of the receiver's ability to reject AM-modulated jammers and represents the combined effect of second order distortion (generated by the jammer) and jammer leakage to the baseband outputs of the mixers.

After downconversion to baseband, the baseband signal level at the mixer output is S_BB, or S_RF+G+S21. The baseband jammer level is J_BB, or J_RF+G+S21(AM). The baseband offset jammer is J_BB_OFFSET, or J_RF+G+S21. The baseband signal to jammer ratio (S_BB/J_BB) may thus be determined. For example, in the CDMA mode for a particular mixer, if G=6 dB, S_RF=-101 dBm, J_RF=-30 dBm (at 2 MHz offset with 99.9% AM modulation), LO=+5 dBm, S31=-60 dB, and S21=12 dB, then J_RF_LEAK=-84 dBm and S21(AM)=-77 dB. It follows that J_BB=-101 dBm and S_BB=-83 dBm. Thus, the baseband signal to jammer ratio equals -83 dBm-(-101 dBm), or +18 dB. For CDMA mode, the typical SINAD to demodulate the signal is -1 dB. Therefore, the AM jammer level shown in the above example is insignificant relative to the noise figure of the receiver.

Figure 7:
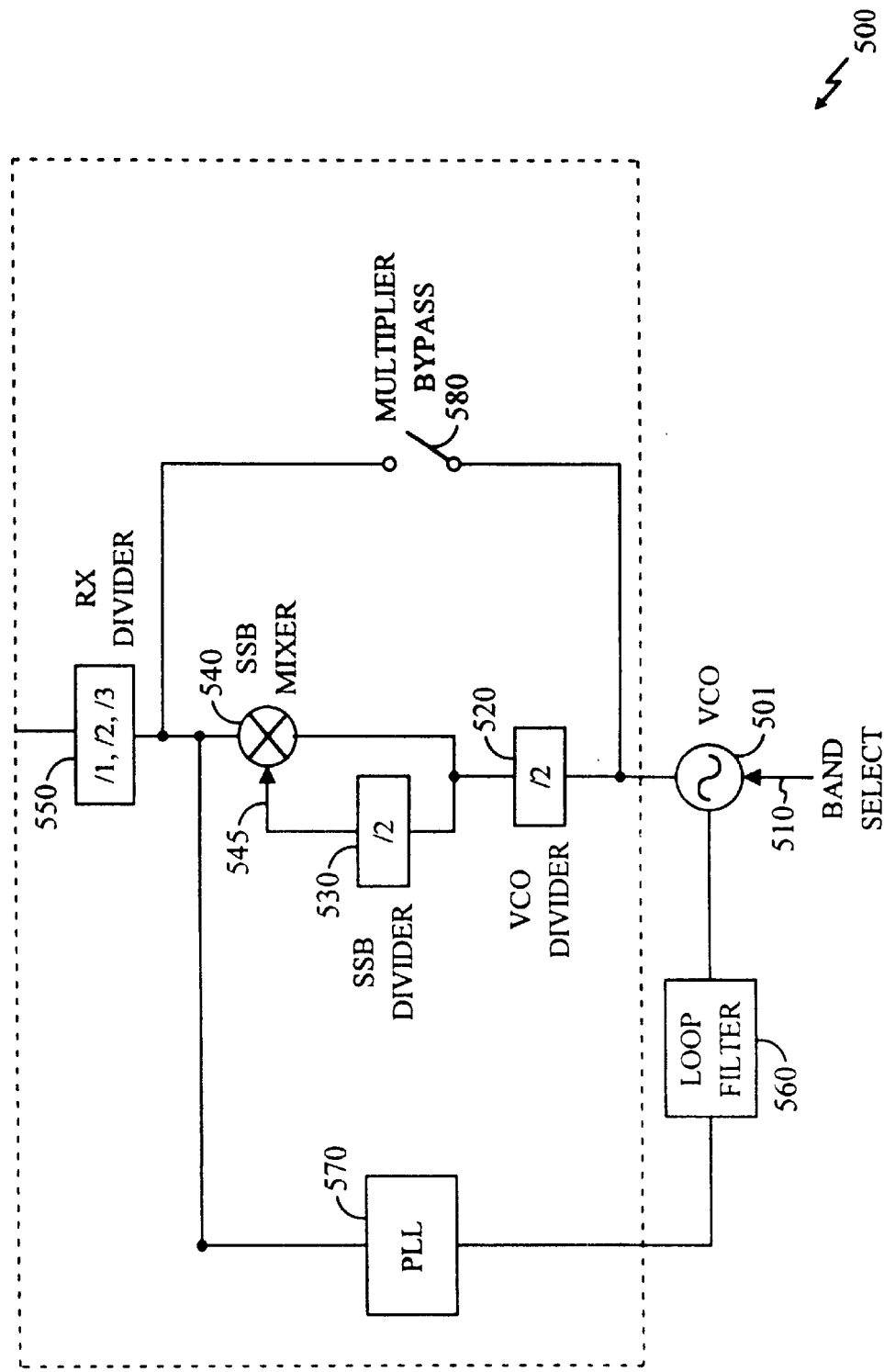
FIG. 7 is a graph plotting mixer RF to LO isolation versus LO drive level.

FIG. 7 is a graph plotting mixer RF to LO isolation versus LO drive level in a receiver. As shown, the mixer RF to LO isolation is not linear, and depends on LO drive level. In an exemplary implementation, the LO drive level of a receiver may be varied or fixed at higher levels to improve isolation. Accordingly, the jammer leakage level at the LO port of the receiver may be suppressed. When no jammers are present, the LO drive level may be lowered. It is to be noted that, relative to an adjustable LO drive level, an LO drive level fixed at higher levels (>+10 dBm) leads to higher current consumption and conducted LO leakage. However, because the DC output of the LO I and Q channel mixers is related to the LO leakage, varying the LO drive level changes the DC offset. Therefore, the DC offset may need to be removed before baseband signals may be demodulated. Other mixer performance parameters may also vary as a function of LO drive level, limiting the range of adjustment. A mixer's noise figure and its IIP2 and IIP3 specifications may degrade if the LO drive level is varied over a wide range.

Figure 8:
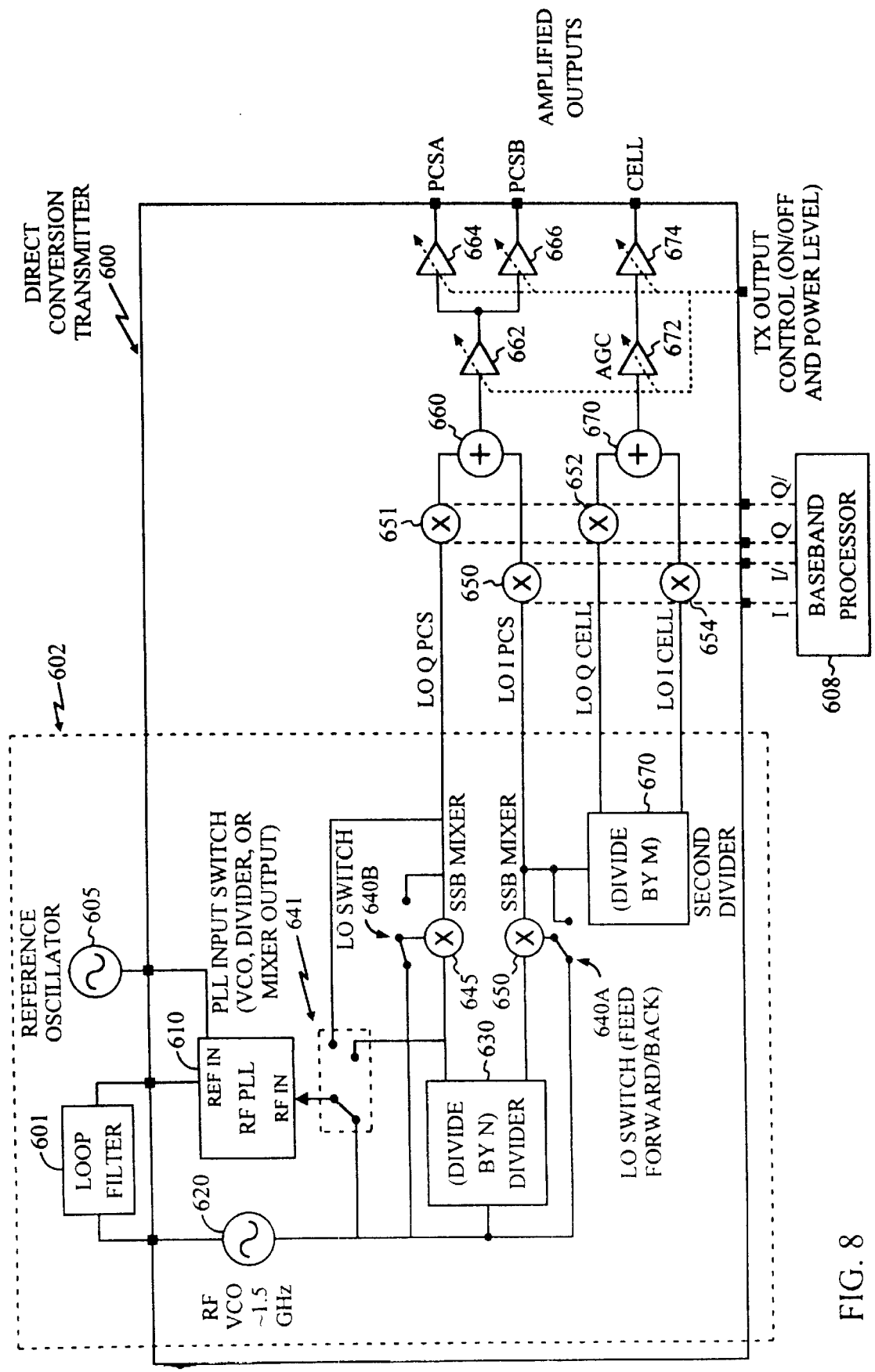
FIG. 8 is a block diagram of a zero IF receiver.

FIG. 8 illustrates zero IF receiver 800, which includes circuitry for suppressing jammer and LO leakage. Receiver 800 may be incorporated into a wireless transceiver. Direct downconversion and baseband circuitry for the I channel is shown in FIG. 8. Parallel circuitry may be provided for the Q channel. FIG. 8 depicts one RF signal path and one baseband path. Consistent with the above teachings, receiver 800 may include multiple paths depending on applicable operating frequency bands and modes. Further, receiver 800 may include circuitry, such as selection mechanism 310 in FIG. 5 above, to switch among signal paths.

In an exemplary implementation, receiver 800 may incorporate differential RF and LO signal paths. Such paths improve RF to LO isolation in receiver 800, thus suppressing jammer and LO leakage. A differential signal path arrangement may be implemented alone or in conjunction with other methods of improving isolation in a receiver, such as those described below.

An antenna 801 interfaces receiver 800 to incoming RF signals. Antenna 801 may also broadcast RF signals from a transmitter coupled to antenna 801. Duplexer 812 filters signals in the incoming receive band and separates those signals from signals in the outgoing transmit band. Duplexer 812 may be associated with one or more particular operating bands, such as US Cellular or PCS. A low noise amplifier 820 is coupled to duplexer 812 and amplifies received RF signals. The gain of LNA 820 may be controlled via an LNA gain control signal 905 (RF_ADJUST). LNA gain control signal 905 may comprise one or more signals depending on whether a continuous gain control or a series of gain steps are employed to meet the requirements for receiver 800 over the desired signal dynamic range.

The gain of LNA 820 may be adjusted depending on the power of received RF signals. As the signal power increases, the gain of LNA 820 may be decreased continuously or in steps. In an exemplary embodiment, LNA 820 has three states, namely, a high gain, bypass, and mid-gain state. The gain of LNA 820 is stepped down at certain signal levels as the signal power increases to enable receiver 800 to meet the interference requirements of various modes without degrading the sensitivity of receiver 800. Gain stepping may also increase the available dynamic range and improve the IIP3 of receiver 800. The gain steps may be made sufficiently small to ensure that the signal power at the output of LNA 820 is above thermal noise. Additionally, sufficient gain in receiver 800 after LNA 820 may be provided to ensure that the signal level at baseband is strong enough to be demodulated.

Figure 9:
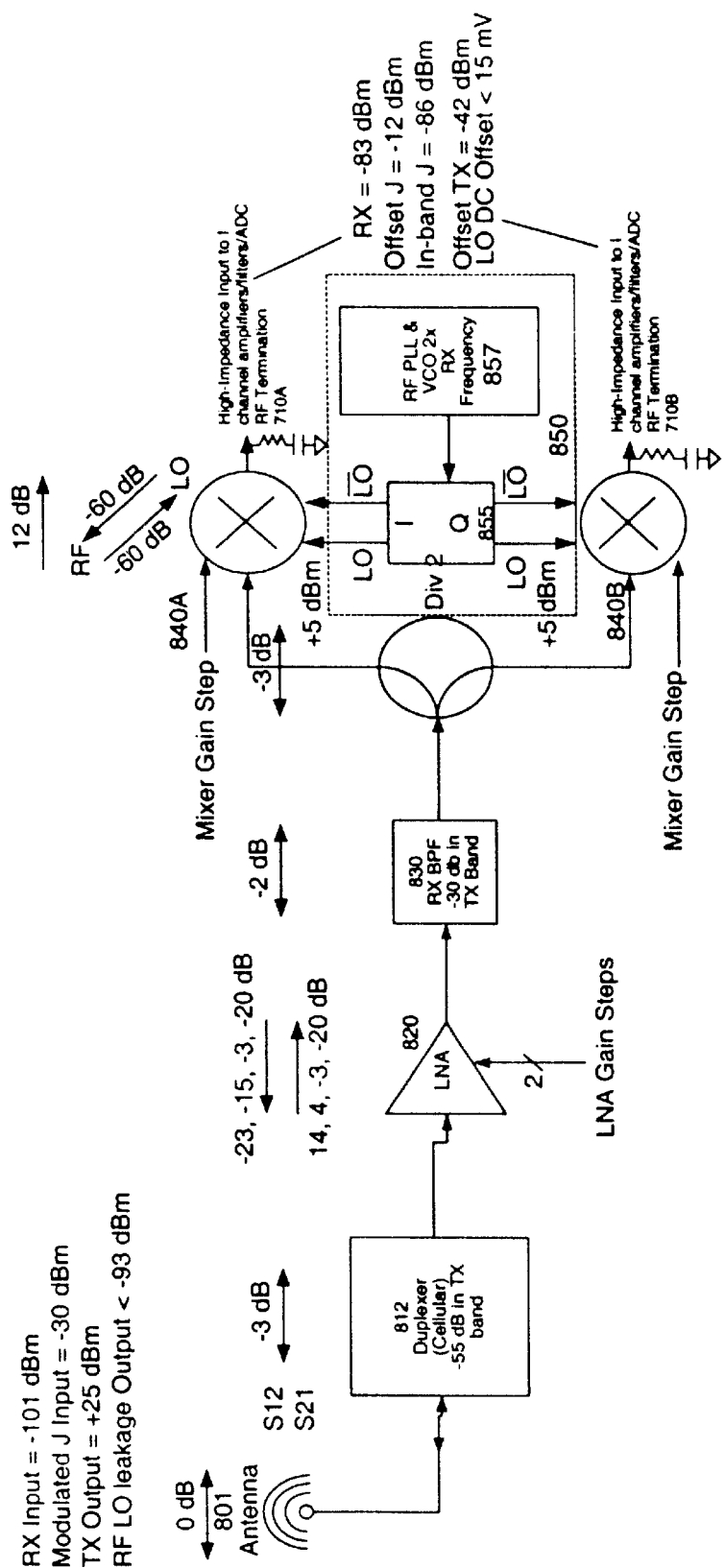
FIG. 9 is a block diagram illustrating gain stepping in a zero IF receiver.

FIG. 9 illustrates an embodiment of a Cellular receiver in which the gain of LNA 820 is varied in steps. For the Cellular and PCS modes, radiated and conducted leakage must be less than −80 dBm. In this embodiment, conducted leakage at antenna 801 is controlled by balancing the reverse isolation of active components in the receive path. The conducted LO leakage is −83 dBm from the combined I and Q signal paths, which translates into a 3 dB specification margin.

Varying only the gain of LNA 820 may be insufficient to meet the SINAD requirements at signal levels above sensitivity (>−74 dBm to −50 dBm signal levels during AWGN [average white gaussian noise] and fading tests for receiver performance). Thus, in the receiver of FIG. 9, as the signal level increases, the gain of LNA 820 and double-balanced mixers 840A, 840B is stepped down to increase the available dynamic range of the receiver. In these lower gain states, the LO leakage may increase above the −80 dBm requirement if the LO level at antenna 801 is less than approximately 20 dB above the signal. It is to be noted that baseband gain steps may be implemented in place of mixer gain steps.

In the embodiment of FIG. 9, mixers 840A, 840B see a 50 ohm RF load at the baseband signal ports. The value of the RF termination may change to suit specific mixer designs. The RF termination reduces LO reflections that may leak into the RF port from the baseband port.

To reduce the radiated LO specification, the frequency synthesizer and RF VCO (first module 857) are run at twice the receive frequency. Second module 855 divides down the output of the frequency synthesizer by two. In other implementations, the synthesizer may be run at the receive frequency, and division may be eliminated. However, additional shielding may be required. In another embodiment, the RF VCO may be run at a fractional multiple of the receive frequency to avoid potential radiated LO leakage in the receive band. It is to be appreciated that design techniques shown in FIG. 9 may be incorporated in whole or in part in direct conversion receivers such as receiver 800.

Referring back to receiver 800 in FIG. 8, LNA 820 is coupled to a RX bandpass filter (BPF) 830. BPF 830 further rejects signals that fall outside of the receive band. The output of BPF 830 is coupled to a directional coupler 915. Directional coupler 915 diverts a portion of the power outputted by BPF 830 to an RF power detector 995, and retains the remaining portion for input into a first input of the I channel LO mixer 840 and a first input of the Q channel LO mixer (not shown).

Local oscillator 850 may comprise a frequency generator that may generate output signals at various frequencies. For instance, LO 850 may output a first signal and a second signal that is phase-shifted from the first signal by 90°. Each signal may be a differential signal. In general, LO 850 may include a phase-locked loop (PLL), a voltage controlled oscillator (VCO), a frequency mixing mechanism, and a phase shifting mechanism. LO 850 may include a band select (not shown) that controls LO 850 depending on an operating frequency of received RF signals.

In FIG. 8, LO 850 includes a first module 857. First module 857 outputs a signal that is a multiple (M/N, where M and N are positive integers) of the frequency of received RF signals. Second module 855 multiplies the output signal by the inverse (N/M) of the multiple. As such, LO 850 outputs a signal at the desired receive frequency, which may be employed to downconvert the received RF signals to baseband signals.

LO 850 is coupled to a buffer amplifier 851. Buffer amplifier 851 is coupled to a second input of mixer 840 and provides impedance matching between LO 850 and mixer 840. The drive level of the LO signal may be adjusted by varying the gain of buffer amplifier 851 via a LO drive adjust control signal 921 (LO_PWR). Buffer amplifier 851 is shown to have a differential input and output, but single-ended inputs and outputs may be employed as well.

I channel mixer 840 and its counterpart for the Q channel may be double-balanced mixers. Isolation of mixer 840 depends on a number of factors, such as substrate isolation, layout, mixer topology, bond wire coupling, and LO drive level. Mixer 840 mixes a received RF signal from directional coupler 915 with a signal received from buffer amplifier 851. The mixing process multiplies the signals together. Thus, mixer 840 directly downconverts received RF signals to I component baseband signals. In some embodiments, mixer 840 has associated gain that may be adjusted via a mixer gain control signal 923 (Mixer Gain Adjust). Thus, the available dynamic range of receiver 800 may be increased.

After downconversion, the I channel baseband signal is processed along a signal path. The signal path may include circuitry to remove a DC offset from the baseband signal. If unremoved, the DC offset may degrade the IIP2 and dynamic range of baseband analog amplifiers and low-pass filters of the receiver. In receiver 800, an analog DC cancellation loop 935 may measure the DC offset in the baseband signal and subtract the offset from the baseband input signal. The DC offset may be measured in the analog baseband signal. The DC offset may also be measured in the baseband signal after it is converted to digital form, and may then be converted back to an analog offset via a digital-to-analog converter (DAC). Alternatively, a digital DC cancellation mechanism may subtract the DC offset from the digital baseband signal. In an exemplary embodiment, such as that shown in FIG. 8, both analog and digital DC cancellation circuitry is included, which may more effectively remove the DC offset.

The I channel baseband signal is inputted to a baseband amplifier 860. Baseband amplifier 860 may have a differential input. Baseband amplifier 860 may scale the baseband signal to increase the dynamic range of receiver 800. The DC input impedance of baseband amplifier 860 may be chosen to be much higher than the output impedance of mixer 840 at DC. For instance, the signal voltage may be doubled relative to the fixed baseband circuitry noise floor, and the baseband signal-to-noise ratio is higher. Other combinations are possible depending on the mixer implementation, such as a current output implementation. However, the voltage gain from the RF input to the baseband output may need to be optimized with respect to noise figure, IIP2, IIP3, and signal and jammer dynamic range.

Baseband amplifier 860 is coupled to a baseband analog filter 870. Analog filter 870 is coupled to an analog-to-digital converter (ADC) 880, which converts the analog I channel baseband signal to a digital signal (I_LADC). In an exemplary embodiment, the output of ADC 880 is at least 13 bits wide. As prescribed by the Nyquist Theorem, the sample rate of ADC 880 should be at least twice the highest frequency component of the analog input signal. To prevent aliasing of interference, such as jammers, into the I channel, analog filter 870 may be selected to reject interference at the sample rate. For instance, if a jammer is 80 dB higher than an input signal at 10 MHz offset, and the sample rate of ADC 880 is 10 MHz, at least 80 dB of attenuation may be necessary to ensure that, when sampled, the power of the jammer is less than that of the input signal. Further, the frequency response of analog filter 870 may be chosen to reject out-of-band jammers to ensure that the effective dynamic range of ADC 880 is not reduced.

ADC 880 is coupled to a DC cancellation module 901. DC cancellation module 901 measures the DC offset in the digital baseband signal. DC cancellation module 901 may sample the digital baseband signal and employ an integrator, such as a first order integrator, to measure the DC offset. Via a feedback arrangement in DC cancellation loop 935, digital-to-analog converter (DAC) 925 converts the digital DC offset to an analog offset. The analog offset is then subtracted from the input of the baseband circuit. In particular, the analog offset is inputted to baseband amplifier 860, which subtracts the offset from the input signal from mixer 840 and amplifies the resulting signal. DC cancellation module 901 may also subtract the digital DC offset from the digital baseband signal and may output a corrected digital baseband signal (I_BB=I_ADC−DC offset).

DC cancellation module 901 may be controlled by a Fast/Slow control signal 945. Fast/Slow control signal 945 may affect the speed of integration employed within DC cancellation module 901. In a fast mode, a less accurate power measurement may be taken, and the DC offset may be removed quickly. For instance, during channel changes (that is, when the frequency of received RF signals changes), or when the LO drive level or mixer gain is stepped up or down, a fast mode may be appropriate. Conversely, in a slow mode, a more accurate power measurement may be taken. Slower integration may track temperature and part-to-part variations of components of receiver 200, reduce the jitter of the DC cancellation circuitry, and yield a lower average of noise at the module output. Thus, use of a slow mode may prevent noise from being introduced into the baseband portion of receiver 200 and maintain signal quality and a desired signal-to-noise ratio. In addition, use of a slow mode may remove less energy from the baseband signal than does a fast mode.

DC cancellation module 901 is coupled to an infinite impulse response (IIR) filter 910. IIR filter 910 may be a fifth order elliptic digital filter designed to reject jammers in the digital baseband signal and to match to the appropriate bandwidth of the baseband signal. In an exemplary implementation, IIR filter 910 provides 70 dB rejection at a jammer offset. IIR filter 910 outputs a filtered signal (I_FILT=I_BB×IIR). In other embodiments, IIR filter 910 may be replaced by a finite impulse response (FIR) filter. Unlike an IIR filter, an FIR filter may have perfectly linear phase and may be maximally flat in amplitude across the signal bandwidth. However, an FIR filter may be larger and more complex than an IIR filter. In another embodiment, an IIR filter may be followed by an FIR filter to equalize the output of the IIR filter. Design techniques for IIR and FIR filters are well known in the art and are not described herein.

IIR filter 910 may include a decimation mechanism. The decimation mechanism reduces the sample rate of a portion of the digital signal path to reduce power consumption and processing hardware. Further, the decimation mechanism should take into account possible aliasing of out-of-channel interferors. In the embodiment shown in FIG. 8, the decimation mechanism is operative at the output of IIR filter 910 after the jammers are removed by analog or digital filtering.

The output of IIR filter 910, I_FILT, is inputted, along with its Q counterpart, Q_FILT (not shown), to a multiplier 970. For each sample, multiplier 970 may detect instantaneous received power 961 for the I channel by squaring the I_FILT signal, and for the Q channel by squaring the Q_FILT signal. The squared signals are proportional to the power of the signal. As an alternative to multiplication, the I_FILT and Q_FILT signals may be inputted to a memory that includes a look-up table. The look-up table may contain values of log power indexed as a function of the magnitudes of the baseband I and Q samples. In other embodiments, separate multipliers 970 or look-up tables may be provided for each channel.

The instantaneous power 961 computed by multiplier 970 may be inputted to an integrator 960. A signal 963 may also be inputted to integrator 960. Signal 963 may comprise a fixed setpoint and I channel offset (Offset_I), which represents the power level that is desired at the output of a multiplier 930 which precedes the demodulator. The power level may be based on the number of bits that the demodulator needs in order to receive the baseband signal and demodulate it without any degradation.

Integrator 960 determines the average signal power from the inputted instantaneous power 961, compares the average signal power with signal 963, and outputs an AGC (automatic gain control) correction signal 965. AGC signal 965 is converted from linear to decibel units by module 940 and summed with an RF_OFFSET signal (in decibels) by summer 950. Summer 950 outputs the total estimated baseband power 967 after filtering (BB_PWR). The RF_OFFSET signal is a programmable offset in decibels that compensates for gain adjustments to LNA 820 or any gain adjustment occurring prior to the digital AGC loop 941 in receiver 800. For instance, if LNA 820 is stepped down in gain by 10 dB, AGC signal 965 will increase because multiplier 970 detects reduced instantaneous power. As such, RF_OFFSET must decrease by 10 dB so that the BB_PWR signal 967 accurately reflects the total received baseband power. It is to be noted that the response time of AGC loop 941 may be varied by adjusting the time constant of integrator 960.

IIR filter 910 is coupled to a multiplier 930. Multiplier 930, which may support linear or floating point multiplication, multiplies the I_FILT signal from IIR filter 910 by the AGC correction signal 965 from integrator 960. Multiplier 930 outputs the I channel baseband signal 999, which is processed by additional processing blocks (not shown), such as a demodulator.

RF power detector 995 outputs an analog signal (in dB) representing the portion of the total RF receive power diverted by directional coupler 915. ADC 990 converts this analog signal into a digital signal 953. Offset 955 is a digital signal (in dB) that may scale digital signal 953. Summer 980 sums digital signal 953 and offset 955 to produce a signal 957 (RF_PWR) representing the total RF receive power (jammer+signal power).

Control mechanism 920 receives BB_PWR signal 967 and RF_PWR signal 957 as inputs. Control mechanism 920 compares these signals and controls setpoints of various modules within receiver 800 based on the comparison. The comparison may include subtracting BB PWR signal 967 from RF_PWR signal 957. In an exemplary implementation, control mechanism 920 controls gain stepping of LNA 820 (via the RF_ADJUST control signal 905), gain of mixer 840 (via the Mixer Gain Adjust control signal 923), and LO drive level (via the LO_PWR control signal 921) to enable receiver 800 to meet jamming requirements for a given modulation standard across the entire applicable dynamic range of the signal. By adjusting the LO drive level, the IIP2 and IIP3 specifications for receiver 800 may be improved when necessary. The control signals may be conveyed by a serial bus interface (SBI) to control inputs of LNA 820 and mixer 840 if multiple gain steps are used. In such embodiments, the SBI may be controlled by a hardware interrupt to quickly write necessary updates in gain.

Control mechanism 920 may also adjust the dynamic range and bias of other devices in receiver 800. Control mechanism 920 may adjust the resolution of ADC 880 (via ADC_RANGE control signal 924), IIR filter 910 (via Filter_Range control signal 928), and multiplier 930 (via MULT_RANGE control signal 929) depending on the signal level. For instance, when the received signal is strong, bits may be truncated off the digital baseband signal. Because the LO drive level may also be adjusted, current consumption in receiver 800 may be optimized. Battery life may thus be extended in portable wireless implementations. Control mechanism 920 may also control DC cancellation module 901 via Fast/Slow control signal 945, as described above.

The ratio (in dB) of the total receive power to the baseband power, or J_RF/S_RF, equals RF_PWR (dB)− BB_PWR (dB). In an embodiment of the present invention, when J_RF/S_RF is less than a threshold value, such as 60 dB, the LO drive level is at a low setpoint, and the dynamic range of ADC 880 and IIR filter 910 are in a non-turbo mode. Conversely, when J_RF/S_RF is greater than the threshold value, then the LO drive level may be increased continuously or stepped up, and the dynamic range of ADC 880 and IIR filter 910 are in a turbo mode. In such a turbo mode, jammers are present and the required dynamic range and LO level are at a maximum. Additionally, the threshold value may be selected based on the requirements for particular wireless standards, such as CDMA, WCDMA, and GSM, including jamming requirements where applicable.

Control mechanism 920 may also output a received signal strength indicator (RSSI) 927. The RSSI is indicative of measured signal power (in dB) and may be used to set the transmitted power to base stations by a transceiver that includes receiver 800. For CDMA wireless systems, transmit power level control is based on a combination of RSSI measurements and continuous base station power control.

For large signals, the RF gain stepping described above for LNA 820 and mixer 840, as well as the baseband filtering (baseband analog filter 870 and IIR filter 910), reduce the dynamic range required of baseband circuitry in receiver 800. However, additional headroom may be needed at ADC 880 to quantize thermal noise of receiver 800. Such headroom, denoted Ns/Nadc, is the ratio of the RX input referred noise to the ADC noise. Moreover, additional headroom may be needed to account for frequency, temperature, and part-to-part variations in the gain of receiver 800.

Additional gain steps may be included in receiver 800 along the RF signal path, such as at LNA 820 or mixer 840, or along the baseband signal path. Such steps may reduce the signal dynamic range requirement of receiver 800. However, the jammer dynamic range may also have to be reduced. Baseband jammer filtering may be included in receiver 800 to reduce the jammer dynamic range. In an exemplary implementation, the RF gain stepping and jammer filter attenuation in receiver 800 may be matched to reduce the baseband dynamic range. The minimum baseband filter rejection at the jammer frequency offset may be dictated by the anti-aliasing requirement for a given sample rate. The sample rate of ADC 880 may be chosen to balance the requirements of the baseband analog filter rejection at the expense of ADC current as the sample rate is increased.

For example, for CDMA-modulated RF signals, the RF RX signal dynamic range is −25 dBm to −108 dBm (noise floor), or 83 dB. To avoid clipping ADC 880, the peak to rms (root mean squared) factor for different modulation standards may be included in dynamic range calculations for a receiver such as receiver 800. For GSM and FM signals, which are constant envelope, the peak to rms power is only 3 dB. For CDMA signals, the peak power (<1% of the time) is approximately 9.5 dB above the rms power level. Assuming that the Ns/Nadc headroom is 10 dB, then the dynamic range with noise headroom is 83 dB+10 dB+9.5 dB, or 102.5 dB. For a 30 dB RF gain step of LNA 820, the dynamic range is reduced to 102.5 dB−30 dB, or 72.5 dB. It is to be noted that this gain step may be split into multiple steps to ensure that the SINAD is met over the desired dynamic range.

The instantaneous jammer range without baseband filtering depends on the jammer modulation, such as continuous wave (CW), CDMA, and FM, and on the jammer level. Assuming a −25 dBm peak power, the instantaneous jammer range without baseband filtering is −25 dBm−(−108 dBm noise floor)+10 dB Ns/Nadc, or 93 dB. If 17 dB jammer filtering is implemented, the instantaneous jammer range is reduced to 93 dB−17 dB, or 76 dB. Additional filtering may be included in the analog domain to ensure that the maximum jammer falls within the ADC dynamic range, and further filtering may be included in the digital domain. Such an approach reduces the hardware complexity of receiver 800 and increases the flexibility of receiver 800 to accommodate various modes and jamming requirements with configurable digital signal processing.

The gain of baseband amplifier 860 may be adjusted as a function of the frequency for each operating band and part-to-part variations of receiver 800 using a DAC voltage or current adjustment. The adjustment may depend on which bands are implemented in receiver 800 and how many segments are calibrated up to the channel spacing. In an exemplary embodiment, a 6 dB adjustment range is included. In receivers such as receiver 800, a 6 dB variation across the RX band and from device-to-device may be found. Such a variation, along with temperature-induced gain changes, increases the dynamic range requirement of the baseband circuitry, including ADC 880. A 6 dB adjustment range for baseband amplifier 860 may improve the receiver noise figure and intercept point, and reduce the baseband dynamic range by more than 3 dB. As such, savings in current of 50 percent for the baseband processing section may be achieved.

As shown in FIG. 8, the I channel baseband signal 999 outputted by multiplier 930 may be conveyed to a demodulation block of receiver 800 (not shown). For narrowband signals, such as FM signals, a frequency offset may be introduced into LO 850 to ensure that the DC cancellation loop circuitry not null out unmodulated baseband signals in FM mode. This technique is described in U.S. Pat. No. 5,617,060, assigned to QUALCOMM Incorporated. In one embodiment, the demodulation block may feed a control signal to LO 850 to introduce a fixed frequency offset. The demodulation block may remove the offset digitally with phase rotators. Such a frequency tracking/offset loop may shift the baseband waveform off DC sufficiently to allow the DC offset loop to remove any baseband 1/f noise.

For instance, the FM signal bandwidth may be 30 kHz (15 kHz I and 15 kHz Q). If the DC offset loop bandwidth is increased to approximately 1 kHz, the frequency loop may push the signal to approximately 15 kHz off DC. The signal may then be rotated back after the digital DC cancellation path in receiver 800.

The foregoing detailed description refers to the accompanying drawings that illustrate exemplary embodiments of the present inventions. Other embodiments are possible and modifications may be made to the embodiments without departing from the spirit and scope of the invention. For instance, many of the above devices may be indirectly coupled to one another such that the devices are separated by intermediate devices, such as filters or amplifiers. Further, some of the above digital embodiments may be replaced by analog equivalents. Moreover, the teachings of the present invention may be applied to future-developed modulation standards and operating bands. Therefore, the detailed description is not meant to limit the invention. Rather, the scope of the invention is defined by the appended claims.

What is claimed:

1. A method for suppressing jammer leakage in a multi-band direct conversion wireless communication device, the method comprising:
   providing a receiver configured to receive RF signals, the receiver including a low noise amplifier (LNA), a mixer having an input and an output, and a local oscillator (LO); and
   adjusting drive level of the LO depending on a level of jammers detected by the receiver;
   wherein the adjusting LO drive level comprises:
   measuring signal power of baseband signals;
   measuring power of the received RF signals;
   comparing the signal power of baseband signals with the power of the received RF signals; and
   adjusting a setpoint of the LO based on the comparing.

2. The method of claim 1, wherein the adjusting drive level comprises increasing the LO drive level as the level of jammers increases.

3. The method of claim 2, wherein the LO drive level is stepped up.

4. The method of claim 1, further comprising removing a DC offset from a downconverted baseband signal.

5. The method of claim 4, wherein the removing the DC offset comprises providing an analog DC cancellation loop.

6. The method of claim 4, wherein the removing the DC offset comprises providing a digital DC cancellation module.

7. The method of claim 1, further comprising controlling, via a digital automatic gain control (AGC) mechanism, power of baseband signals inputted to a demodulator of the receiver.

8. A method for suppressing jammer leakage in a multi-band direct conversion wireless communication device, the method comprising:
   providing a receiver configured to receive RF signals, the receiver including a low noise amplifier (LNA), a mixer having an input and an output, and a local oscillator (LO); and
   adjusting drive level of the LO depending on a level of jammers detected by the receiver;
   wherein the adjusting LO drive level comprises:
   measuring signal power of baseband signals;
   measuring power of the received RF signals;
   comparing the signal power of baseband signals with the power of the received RF signals; and
   adjusting a setpoint of the LO based on the comparing;
   further comprising adjusting gain of the LNA and the mixer based on the measured signal power of baseband signals.

9. A method for suppressing jammer leakage in a multi-band direct conversion wireless communication device, the method comprising:
   providing a receiver configured to receive RF signals, the receiver including a low noise amplifier (LNA), a mixer having an input and an output, and a local oscillator (LO); and
   adjusting drive level of the LO depending on a level of jammers detected by the receiver;
   wherein the adjusting LO drive level comprises:
   measuring signal power of baseband signals;
   measuring power of the received RF signals;
   comparing the signal power of baseband signals with the power of the received RF signals; and
   adjusting a setpoint of the LO based on the comparing;
   further comprising adjusting gain of the LNA and the mixer based on the measured signal power of baseband signals;
   wherein the adjusting the LNA and mixer gain comprises lowering the gain as the signal power of the received RF signals increases.

10. A system for suppressing jammer leakage in a multi-band direct conversion wireless communication receiver, the system comprising:
    a low noise amplifier (LNA) configured to amplify received RF signals;
    a local oscillator (LO) configured to output a frequency;

a mixer having a first input operatively coupled to the LNA, a second input operatively coupled to the LO output, and an output; and an adjustment mechanism configured to adjust drive level of the LO depending on a level of jammers detected by the receiver;

wherein the adjustment mechanism comprises:
- a first measurement mechanism configured to measure total power of the received RF signals;
- a second measurement mechanism configured to measure signal power of baseband signals;
- a comparison mechanism configured to compare the total power of the received RF signals with the signal power of baseband signals; and
- an adjustor configured to adjust a setpoint of the LO based on the comparison.

11. The system of claim 10, wherein the adjustment mechanism sends a control signal to the LO, the control signal adjusting a setpoint of the LO.

12. The system of claim 10, further comprising a buffer amplifier coupled to the LO and to the second mixer input, wherein the adjustment mechanism adjusts gain of the buffer amplifier to adjust the LO drive level.

13. The system of claim 10, wherein the adjustment mechanism is further configured to adjust gain of the LNA and the mixer as the signal level of the received RF signals increases.

14. The system of claim 10, wherein the receiver incorporates differential RF and LO signal paths.

15. The system of claim 10, further comprising a DC cancellation mechanism configured to remove a DC offset from a downconverted baseband signal.

16. The system of claim 15, wherein the DC cancellation mechanism includes an analog DC cancellation loop.

17. The system of claim 15, wherein the DC cancellation mechanism includes a digital DC cancellation module configured to subtract the DC offset from the downconverted baseband signal.

18. The system of claim 10, further comprising a demodulator configured to remove a frequency offset from an FM-modulated digital baseband signal.

19. A system for suppressing jammer leakage in a multi-band direct conversion wireless communication receiver, the system comprising:
- a low noise amplifier (LNA) configured to amplify received RF signals;
- a local oscillator (LO) configured to output a frequency;
- a mixer having a first input operatively coupled to the LNA, a second input operatively coupled to the LO output, and an output; and
- an adjustment mechanism configured to adjust drive level of the LO depending on a level of jammers detected by the receiver;

wherein the adjustment mechanism comprises:
- a first measurement mechanism configured to measure total power of the received RF signals;
- a second measurement mechanism configured to measure signal power of baseband signals;
- a comparison mechanism configured to compare the total power of the received RF signals with the signal power of baseband signals; and
- an adjustor configured to adjust a setpoint of the LO based on the comparison;

wherein the first measurement mechanism includes:
- an RF power detector configured to output an analog signal representing power of the received RF signals;
- an analog-to-digital converter (ADC) having an output and an input coupled to the RF power detector output; and
- a summer having a first input coupled to the ADC output and a second input coupled to an offset signal, the summer being configured to produce an output signal that represents the total power of the received RF signals.

20. A system for suppressing jammer leakage in a multi-band direct conversion wireless communication receiver, the system comprising:
- a low noise amplifier (LNA) configured to amplify received RF signals;
- a local oscillator (LO) configured to output a frequency;
- a mixer having a first input operatively coupled to the LNA, a second input operatively coupled to the LO output, and an output; and
- an adjustment mechanism configured to adjust drive level of the LO depending on a level of jammers detected by the receiver;

wherein the adjustment mechanism comprises:
- a first measurement mechanism configured to measure total power of the received RF signals;
- a second measurement mechanism configured to measure signal power of baseband signals;
- a comparison mechanism configured to compare the total power of the received RF signals with the signal power of baseband signals; and
- an adjustor configured to adjust a setpoint of the LO based on the comparison;

wherein the second measurement mechanism includes:
- a calculator configured to determine instantaneous power of baseband signals;
- an integrator having an input coupled to the calculator, the integrator determining average signal power of the baseband signals and outputting an automatic gain control (AGC) signal; and
- a summer configured to sum a log power representation of the AGC signal with an RF offset, the RF offset accounting for adjustments to gain of the LNA and the mixer, the summer being configured to output signal power of baseband signals.

21. A system for suppressing jammer leakage in a multi-band direct conversion wireless communication receiver, the system comprising:
- a low noise amplifier (LNA) configured to amplify received RF signals;
- a local oscillator (LO) configured to output a frequency;
- a mixer having a first input operatively coupled to the LNA, a second input operatively coupled to the LO output, and an output; and
- an adjustment mechanism configured to adjust drive level of the LO depending on a level of jammers detected by the receiver;

wherein the adjustment mechanism comprises:
- a first measurement mechanism configured to measure total power of the received RF signals;
- a second measurement mechanism configured to measure signal power of baseband signals;
- a comparison mechanism configured to compare the total power of the received RF signals with the signal power of baseband signals; and
- an adjustor configured to adjust a setpoint of the LO based on the comparison;

wherein the second measurement mechanism includes:

a calculator configured to determine instantaneous power of baseband signals;

an integrator having an input coupled to the calculator, the integrator determining average signal power of the baseband signals and outputting an automatic gain control (AGC) signal; and a summer configured to sum a log Power representation of the AGC signal with an RF offset, the RF offset accounting for adjustments to gain of the LNA and the mixer, the summer being configured to output signal power of baseband signals;

wherein the calculator includes a multiplier configured to square signal levels of the I channel of the receiver.

22. A system for suppressing jammer leakage in a multi-band direct conversion wireless communication receiver, the system comprising:

a low noise amplifier (LNA) configured to amplify received RF signals;

a local oscillator (LO) configured to output a frequency;

a mixer having a first input operatively coupled to the LNA, a second input operatively coupled to the LO output, and an output; and an adjustment mechanism configured to adjust drive level of the LO depending on a level of jammers detected by the receiver;

wherein the adjustment mechanism comprises:

a first measurement mechanism configured to measure total power of the received RF signals;

a second measurement mechanism configured to measure signal power of baseband signals;

a comparison mechanism configured to compare the total power of the received RF signals with the signal rower of baseband signals; and an adjustor configured to adjust a setpoint of the LO based on the comparison;

wherein the second measurement mechanism includes:

a calculator configured to determine instantaneous power of baseband signals;

an integrator having an input coupled to the calculator, the integrator determining average signal power of the baseband signals and outputting an automatic gain control (AGC) signal; and a summer configured to sum a log power representation of the AGC signal with an RF offset, the RF offset accounting for adjustments to gain of the LNA and the mixer, the summer being configured to output signal power of baseband signals;

wherein the calculator includes a look-up table including instantaneous power values associated with signal levels of the I channel of the receiver.

23. A system for suppressing jammer leakage in a multi-band direct conversion wireless communication receiver, the system comprising:

a low noise amplifier (LNA) configured to amplify received RF signals;

a local oscillator (LO) configured to output a frequency;

a mixer having a first input operatively coupled to the LNA, a second input operatively coupled to the LO output, and an output; and an adjustment mechanism configured to adjust drive level of the LO depending on a level of jammers detected by the receiver;

wherein the adjustment mechanism comprises:

a first measurement mechanism configured to measure total power of the received RF signals;

a second measurement mechanism configured to measure signal power of baseband signals;

a comparison mechanism configured to compare the total power of the received RF signals with the signal power of baseband signals; and an adjustor configured to adjust a setpoint of the LO based on the comparison;

wherein the comparison mechanism subtracts the total power of the received RF signals from the signal power of the baseband signals.

24. A system for suppressing jammer leakage in a multi-band direct conversion wireless communication receiver, the system comprising:

a low noise amplifier (LNA) configured to amplify received RF signals;

a local oscillator (LO) configured to output a frequency;

a mixer having a first input operatively coupled to the LNA, a second input operatively coupled to the LO output, and an output; and an adjustment mechanism configured to adjust drive level of the LO depending on a level of jammers detected by the receiver;

further comprising a DC cancellation mechanism configured to remove a DC offset from a downconverted baseband signal;

wherein the DC cancellation mechanism includes a digital DC cancellation module configured to subtract the DC offset from the downconverted baseband signal wherein the digital DC cancellation module is configured to operate in a fast and a slow mode, the modes having different integration rates.

25. A method for optimizing dynamic range in a multi-band direct conversion wireless communication device, the method comprising:

providing a receiver configured to receive RF signals, the receiver including a low noise amplifier (LNA), a mixer having an input and an output, a local oscillator (LO), and a baseband portion;

adjusting gain of the LNA and the mixer depending on a level of the received RF signals; and adjusting drive level of the LO depending on a level of jammers detected by the receiver.

26. The method of claim 25, further comprising adjusting the bit width of digital signals in the baseband portion of the receiver.

27. The method of claim 26, wherein the adjusting the bit width comprises truncating bits off digital baseband signals when signal power of the received RF signals is strong.

28. The method of claim 26, wherein the adjusting the bit width comprises adjusting the resolution of an analog-to-digital converter (ADC) in the baseband portion of the receiver.

29. The method of claim 26, wherein the adjusting the bit width comprises adjusting the resolution of a digital filter in the baseband portion of the receiver.

30. The method of claim 25, further comprising adjusting a sample rate of an ADC in the baseband portion of the receiver.

31. The method of claim 25, wherein the step of providing comprises providing a baseband portion that includes a baseband amplifier.

32. The method of claim 31, further comprising adjusting gain of the baseband amplifier based on one of part-to-part variations of the receiver and frequency of an operating band.

33. The method of claim 32, wherein the gain of the baseband amplifier is adjusted over a 6 dB range.

34. The method of claim 25, wherein the step of providing comprises providing a baseband portion that includes a baseband analog filter.

35. A system for optimizing dynamic range in a multi-band direct conversion wireless communication receiver, the system comprising:
- a low noise amplifier (LNA) configured to amplify received RF signals;
- a local oscillator (LO) configured to output a frequency;
- a mixer having a first input operatively coupled to the LNA, a second input operatively coupled to the LO output, and an output;
- a baseband portion coupled to the mixer output; and
- an adjustment mechanism configured to adjust gain of the LNA and the mixer depending on a level of the received RF signals and drive level of the LO depending on a level of jammers detected by the receiver.

36. The system of claim 35, wherein the adjustment mechanism is further configured to adjust the bit width of digital signals in the baseband portion of the receiver.

37. The system of claim 36, wherein the adjustment mechanism is configured to truncate bits off digital baseband signals when signal power of the received RF signals is strong.

38. The system of claim 36, wherein the adjustment mechanism is configured to adjust the resolution of an analog-to-digital converter (ADC) in the baseband portion of the receiver.

39. The system of claim 36, wherein the adjustment mechanism is configured to adjust the resolution of a digital filter in the baseband portion of the receiver.

40. The system of claim 35, wherein the adjustment mechanism is configured to adjust a sample rate of an ADC in the baseband portion of the receiver.

41. The system of claim 35, wherein the baseband portion comprises a baseband amplifier.

42. The system of claim 41, wherein the adjustment mechanism is configured to adjust gain of the baseband amplifier based on one of part-to-part variations of the receiver and frequency of an operating band.

43. The system of claim 42, wherein the baseband amplifier is configured to be adjusted over a 6 dB range.

44. The system of claim 42, wherein the baseband amplifier is configured to be adjusted with a digital-to-analog (DAC) voltage or current adjustment.

45. The system of claim 35, wherein the baseband portion comprises a baseband analog filter.

* * * * *